(12) United States Patent
Lian et al.

(10) Patent No.: US 7,888,140 B2
(45) Date of Patent: Feb. 15, 2011

(54) MAGNETIC SELF-ASSEMBLY FOR INTEGRATED CIRCUIT PACKAGES

(75) Inventors: Ming-Ren Lian, Boca Raton, FL (US); Gary Mark Shafer, Charlotte, NC (US); George A. Reynolds, Delray Beach, FL (US)

(73) Assignee: Sensormatic Electronics, LLC, Boca Raton, FL (US)

( * ) Notice: Subject to any disclaimer, the term of this patent is extended or adjusted under 35 U.S.C. 154(b) by 0 days.

(21) Appl. No.: 12/586,687

(22) Filed: Sep. 26, 2009

(65) Prior Publication Data

US 2010/0015730 A1 Jan. 21, 2010

Related U.S. Application Data

(62) Division of application No. 11/074,114, filed on Mar. 7, 2005, now Pat. No. 7,615,836.

(51) Int. Cl.
*H01L 21/00* (2006.01)

(52) U.S. Cl. .................. 438/3; 438/637; 438/638; 257/E21.579

(58) Field of Classification Search .............. 438/3, 438/637, 638; 257/E21.579
See application file for complete search history.

(56) References Cited

FOREIGN PATENT DOCUMENTS

JP 2002057433 A * 2/2002

* cited by examiner

*Primary Examiner*—Michelle Estrada

(57) ABSTRACT

An integrated circuit package may include a substrate and an integrated circuit. The substrate may include at least one region, and a first magnetic material associated with the at least one region. The integrated circuit may have a second magnetic material associated therewith. The second magnetic material may be attracted to the first magnetic material to coupled the integrated circuit to the at least one region of the substrate. The IC package may be utilized in an RFID tag of an RFID system. An associated method for assembling an integrated circuit to a substrate is also provided.

16 Claims, 8 Drawing Sheets

US 7,888,140 B2

MAGNETIC SELF-ASSEMBLY FOR INTEGRATED CIRCUIT PACKAGES

CROSS-REFERENCE TO RELATED APPLICATIONS

This application is a divisional of U.S. patent application Ser. No. 11/074,114, filed Mar. 7, 2005 entitled MAGNETIC SELF-ASSEMBLY FOR INTEGRATED CIRCUIT PACKAGES, now U.S. Pat. No. 7,615,836, the entire disclosure of which is hereby expressly incorporated by reference.

FIELD OF THE INVENTION

This disclosure relates to integrated circuits, and in particular, to integrated circuit packages formed using magnetic self-assembly. The integrated circuit packages may be utilized in a variety of systems such as in a radio frequency identification (RFID) system.

BACKGROUND OF THE INVENTION

Integrated circuits (ICs) are utilized in a variety of electronic devices to perform a myriad of functions. Integrated circuits may be packaged with a substrate to protect the IC and to provide electrical connections from the substrate to the contacts of the IC. In general, functionality provided by ICs has increased over the years while IC costs have decreased. However, the costs associated with packaging an IC with a substrate have not experienced a comparative cost reduction. In fact, packaging costs may even increase in the future given the trend towards reduced IC sizes and complicated interconnection schemes.

One conventional method of connecting an IC to a substrate involves placing the IC on the substrate, either manually or using a robotic arm. This conventional process requires human intervention and/or complex robotic machinery and becomes increasingly difficult as IC sizes decrease. This conventional process also usually requires a wire-bonding process to electrically connect contact pads of the IC to other components or terminals.

Another conventional method of connecting an IC to a substrate involves use of fluid flow. The fluid flow method involves creation of a plurality of shaped recesses in a substrate configured to mate with correspondingly shaped ICs. A slurry containing a plurality of the shaped ICs is directed over the substrate, and the ICs fall into the recesses in the substrate. The substrate may be examined for empty recesses and other devices such as a robotic arm may then place ICs into the empty regions. This fluid flow approach requires formation of particularly shaped recesses in the substrate, which requires additional precision and cost. The ICs must also be precisely manufactured with complimentary mating geometries to mate with the recesses. Furthermore, the fluid flow approach can leave an excessive number of empty recesses on the substrate, since gravity may be the only force urging the ICs into the recesses.

Accordingly, there is a need for a magnetic self-assembly for integrated circuit packages to simplify IC package manufacturing and reduce manufacturing costs. Such a method may be used in a variety of applications and systems. One application may be to manufacture RFID tags at reduced costs compared to conventional methods. Such RFID tags may be used in an RFID system for tagging retail merchandise where the cost of the RFID tag is an important factor.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Systems and methods consistent with the present invention will be described herein in connection with various embodiments. Those skilled in the art will recognize that the features and advantages of the present invention may be implemented in a variety of configurations. It is to be understood, therefore, that the embodiments described herein are presented by way of illustration, not of limitation.

Figure 1:
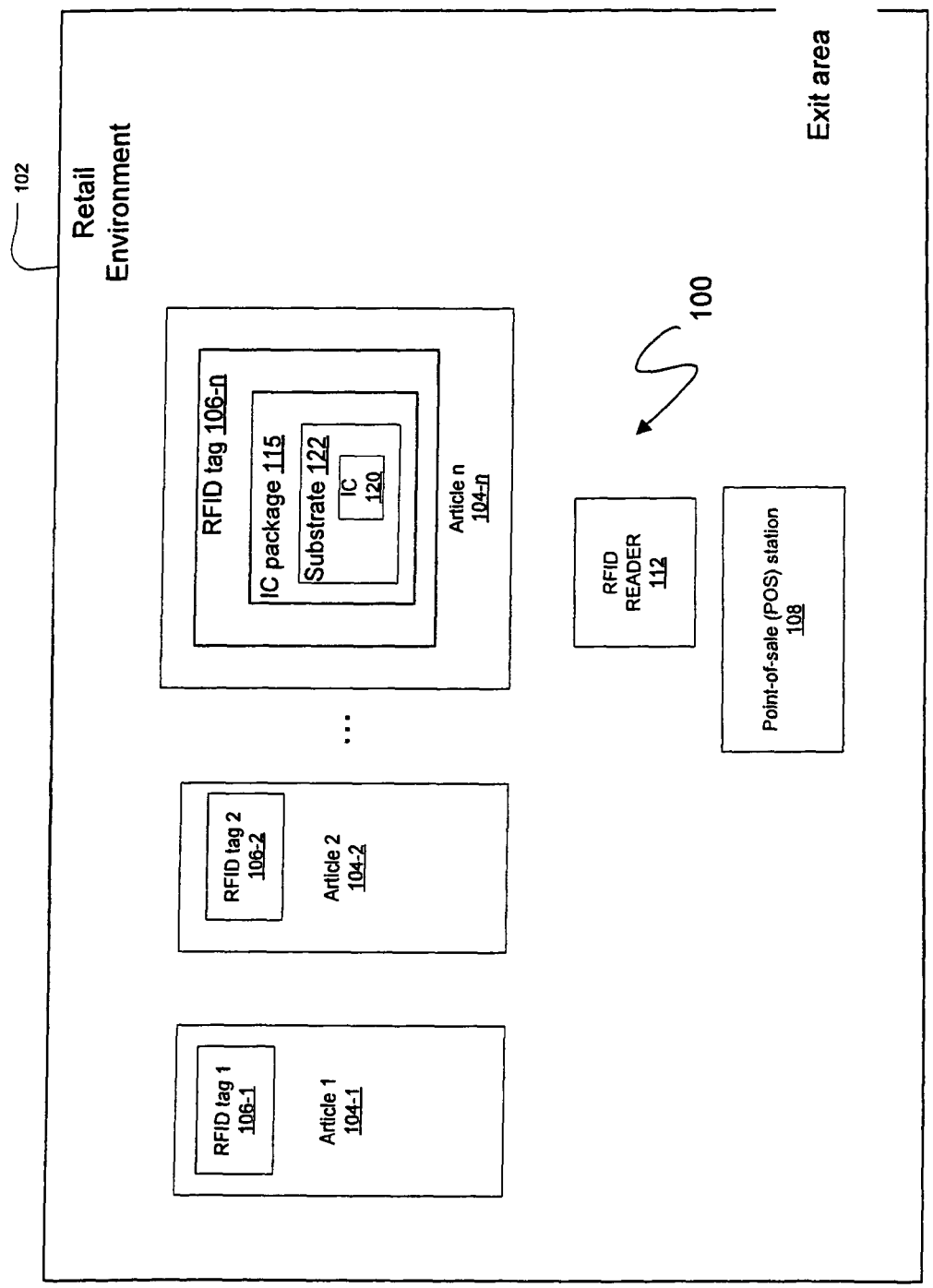
FIG. 1 is block diagram of a RFID system for use in a retail environment.

FIG. 1 illustrates an RFID system 100 utilized in a retail environment 102. The RFID system 100 may include a plurality of RFID tags 106-1, 106-2 ... 106-n and an RFID reader 112. Each of the RFID tags 106-1, 106-2 ... 106-n may be affixed to an associated article 104-1, 104-2 ... 104-n presented for purchase in the retail environment 102. The RFID reader 112 may be portable or may be fixed to a particular location, e.g., to a location proximate a point-of-sale (POS) station 108. The RFID reader 112 may scan for RFID tags 106-1, 106-2 ... 106-n by transmitting an interrogation signal at a known frequency. RFID tags may respond to the interrogation signal with a response signal containing, for example, data associated with the article to which it is affixed. The RFID reader 112 may include processing capabilities to detect the response signal and decode the data. Since the RFID system 100 utilizes radio wave signals to communicate data, no line of sight between the RFID reader 112 and RFID tags 106-1, 106-2 ... 106-n is required.

One or more of the RFID tags, as shown in connection with RFID tag 106-n, may include an IC package 115 including an IC 120 coupled to a substrate 122. As used herein, an "integrated circuit" or IC means a semiconductor device and/or microelectronic device, such as, for example, a semiconductor integrated circuit chip. The substrate 122 may include an antenna. The IC 120 may include computer processing capabilities and a certain amount of memory depending on the type of RFID tag 106-n. The IC package 115 of the RFID tag 106-n may be manufactured according to the embodiments detailed herein to enable associated cost reductions in the manufacture of RFID tags. Of course, IC packages manufactured according to the magnetic self-assembly embodiments detailed herein may also be utilized in a variety of other systems and devices.

Figure 2A:
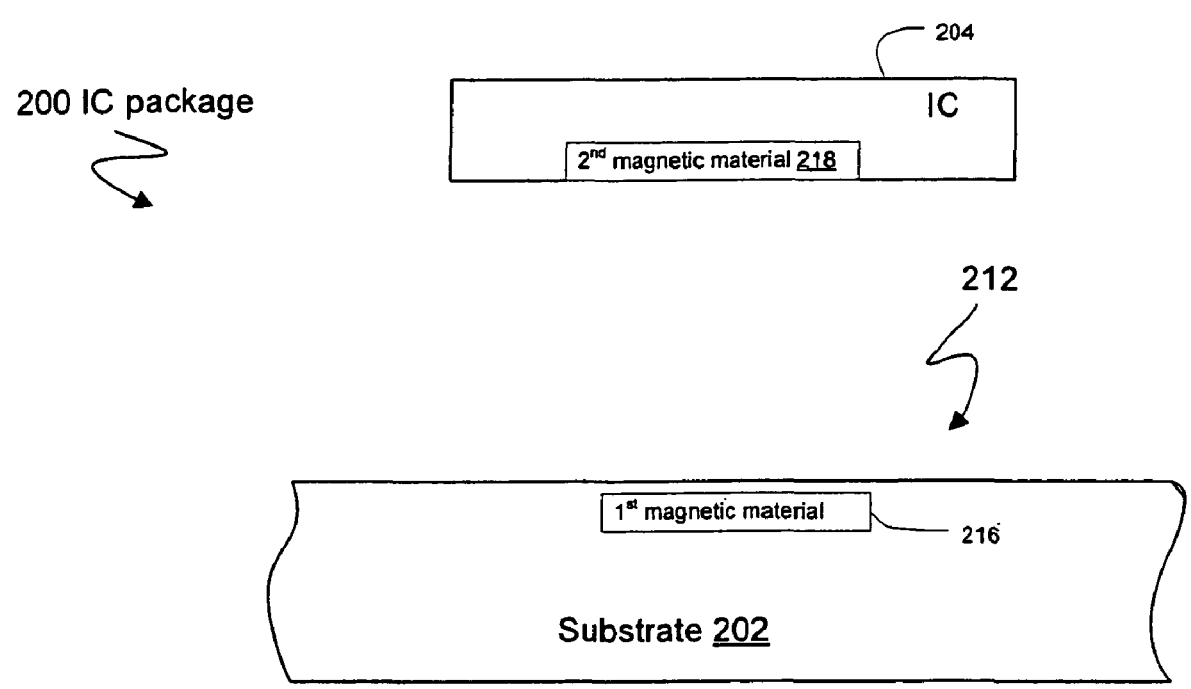
FIG. 2A is an exploded cross-sectional view of an IC and substrate for accepting the IC.

FIG. 2A is an exploded view of an integrated circuit package 200 including a substrate 202 and an IC 204. The substrate 202 may be formed from a variety of materials including flexible materials and may include one or more regions 212 to mate with the IC 204. In some embodiments, the region 212 may be recessed relative to a top surface of the substrate. A recessed region may be provided in any geometric shape and may be dimensioned to accept at least a portion of the IC 204. In one embodiment, the recessed region may be configured to mate with a correspondingly shaped IC.

The substrate 202 may include a first magnetic material 216 associated therewith. The first magnetic material may, for example, be disposed on or beneath a surface of the region 212. A second magnetic material 218 may be associated with the IC 204. For example, the second magnetic material may be disposed on or beneath a surface of the IC. Although the first 216 and second 218 magnetic materials are illustrated as having particular orientations relative to the substrate and IC, respectively, it is to be understood that the magnetic materials may be associated with the IC and substrate by providing the material completely or partially on a surface, completely or partially beneath a surface, or integral with the IC or substrate. Also, the magnetic materials may be provided at any location on or within the IC or substrate.

Figure 2B:
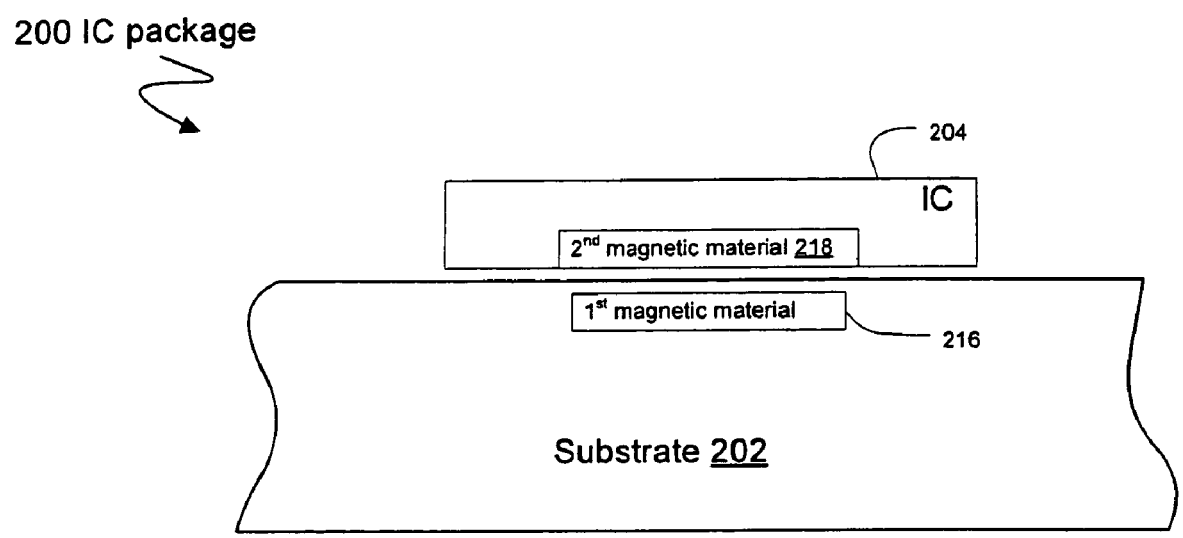
FIG. 2B is a cross-sectional view of the IC and substrate of FIG. 2A where the IC is coupled to the substrate.

The first and second magnetic materials 216, 218 may, for example, include high energy metallic magnetic materials. Examples of such materials include, but are not limited to iron platinum, cobalt platinum, and copper. As the IC 204 is transported about the substrate 202 by any of a variety of techniques, it is, aided into position, e.g. as shown in FIG. 2B, by the magnetic attraction between materials 216 and 218.

Figure 3:
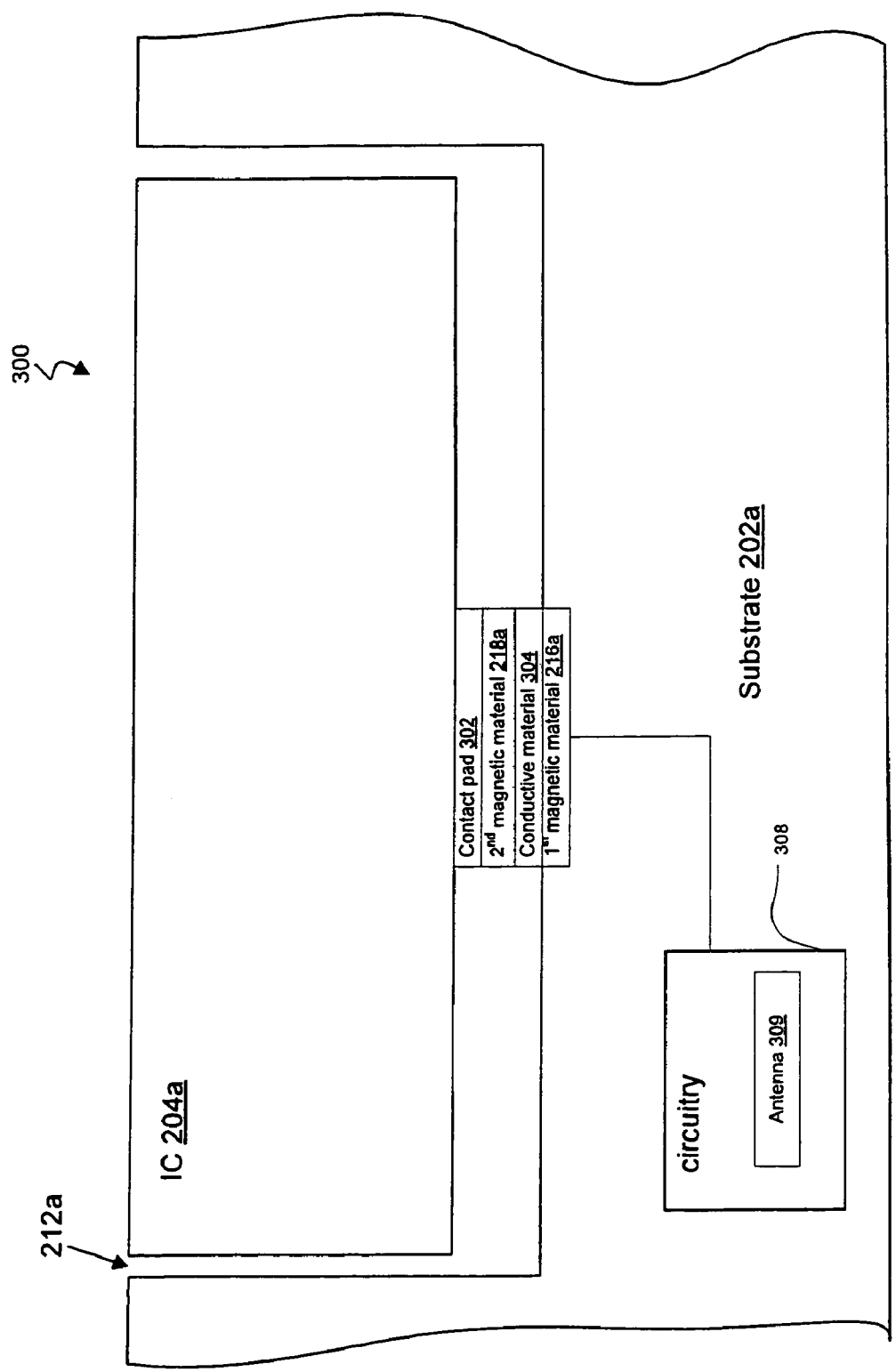
FIG. 3 is a cross-sectional view of an electrical connection formed between an IC and substrate.

FIG. 3 illustrates another embodiment of an IC package 300 that provides for magnetic self-assembly of the IC 204*a* to the substrate 202*a* and also facilitates formation of an electrical connection between the IC 204*a* and the substrate 202*a*. In the embodiment of FIG. 3, the region 212 of FIG. 2A may be a recessed region 212*a*. The IC 204*a* may include a contact pad 302. Although only one contact pad 302 is illustrated for clarity, the IC 204*a* may include a plurality of contact pads. The second magnetic material 218*a* may be disposed on the contact pad 302. In addition, a conductive material 304 may initially be attached to the second magnetic material 218*a*. Alternatively, the conductive material may initially be attached to the first magnetic material 216*a*.

The conductive material 304 may be a conductive adhesive in one embodiment such as a thermally activated conductive adhesive. In one example, the conductive adhesive may be a conductor-filled thermal set adhesive film such as the Z-Axis Adhesive Film 7303 by 3M Corporation. In other examples, the conductive adhesive 304 may be a thermoplastic conductive adhesive or a non-heat activated conductive adhesive such as a room temperature adhesive. The conductive material 304 may also be solder. The solder may be applied as a solder paste or applied to form solder bumps. The first magnetic material 216*a* may be positioned in or on the recessed region 212*a* with an exposed portion that contacts the conductive material 304, as shown, for example, in FIG. 3.

As the IC 204*a* is attracted into the region of the substrate 202*a* by the magnetic attraction of the first and second magnetic materials 216*a*, 218*a*, the first and second magnetic materials 216*a*, 218*a* may become affixed to each other via the conductive material 304 to form an electrical connection between the IC 204*a* and circuitry 308 of the substrate 202*a*. As used herein, "circuitry" may include, for example, singly or in any combination, hardwired circuitry, programmable circuitry, state machine circuitry, and/or firmware that stores instructions executed by programmable circuitry. In one RFID tag embodiment, the circuitry 308 may comprise an antenna 309 and the first magnetic material 216*a* may be deposited at an input port to the antenna.

To make the electrical connection between the IC 204*a* and the substrate 202*a* permanent when using a thermally activated conductive material, heat may be applied to the material and pressure may be applied to urge the first and second magnetic material 216*a*, 218*a* towards each other. The heat may be sufficient to bond the first and second materials 216*a*, 218*a* to the conductive material 304 to form a permanent electrical connection between the IC 204*a* and the substrate 202*a*.

In some embodiments, a particular orientation of the integrated circuit relative to the substrate may not be critical. This may be the case for some RFID tag embodiments. In this instance, one of the first or second magnetic materials 216 or 218 associated with the substrate 202 or the IC 204 may be a soft magnetic material, such as a nickel or iron-based alloy. The other of the first and second magnetic materials may have a permanent magnetization such as from a permanent magnet. In this embodiment, as the soft magnetic material moves closer to the field of the permanent magnet, the soft magnetic layer may be attracted to the permanent magnet.

Figure 4:
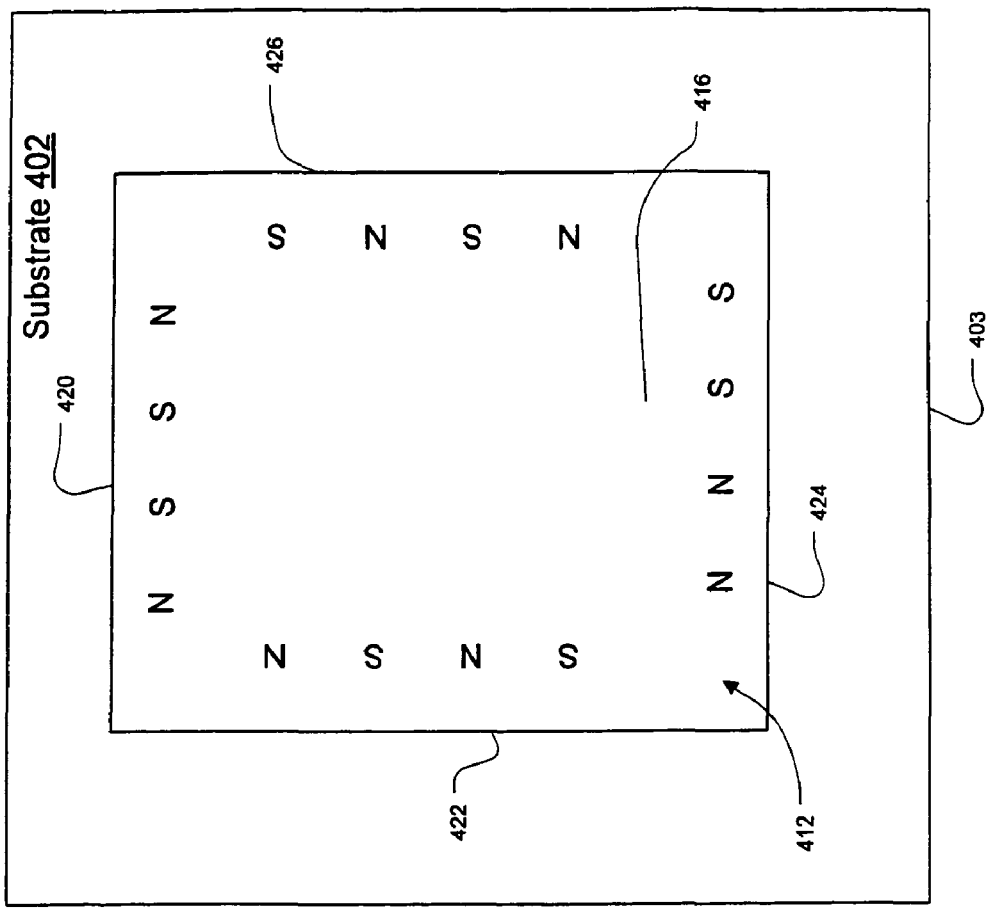
FIG. 4 illustrates an embodiment of a magnetic keying arrangement to particularly position the IC on the substrate.
Figure 4:
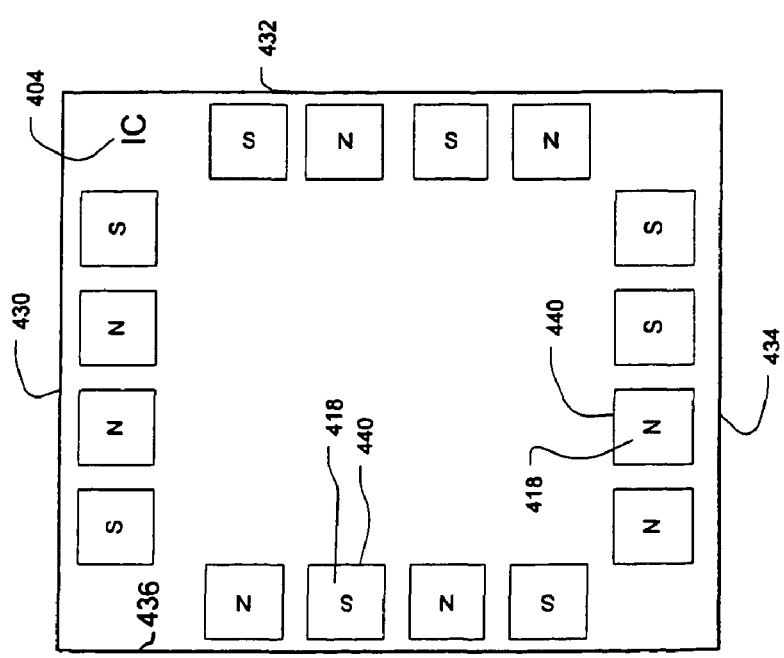

In other embodiments, a particular orientation of the IC relative to the substrate may be desired. FIG. 4 illustrates an embodiment of a magnetic keying arrangement to particularly position the IC 404 relative to the substrate 402. The IC 404 is illustrated with its mating side facing outward, and has a rectangular configuration. A plurality of contact pads 440, e.g. sixteen in the illustrated embodiment, may be provided on the IC and the second magnetic material 418 may be disposed on each of the plurality of contact pads to establish an arrangement of North (N) and South (S) magnetization polarities keyed to an associated arrangement in a substrate.

The substrate is shown in top view and includes a top surface 403 with a rectangular region 412 formed thereon. In the illustrated exemplary embodiment, the region 412 is adapted to mate with and receive the IC 404. The first magnetic material 416 may be disposed on or within a bottom surface of the region and may be magnetized to establish a magnetization polarity arrangement keyed to arrangement on the IC.

As shown, for example, side 420 of the first magnetic material 416 may have polarities N, S, S, N to attract the side 430 of the IC 404 having polarities S, N, N, S, respectively. Side 422 may have polarities S, N, S, N to attract polarities N, S, N, S, respectively, of side 432 of the IC 404. Side 426 may have polarities N, S, N, S to attract polarities S, N, S, N, respectively, of side 436 of the IC. Finally, side 424 may have polarities N, N, S, S to attract polarities S, S, N, N, respectively, of side 434 of the IC. The arrangement of magnetic polarities on the substrate and the IC thus establishes a magnetic keying arrangement whereby the IC 402 may be attracted to a particular orientation on the substrate.

Figure 5:
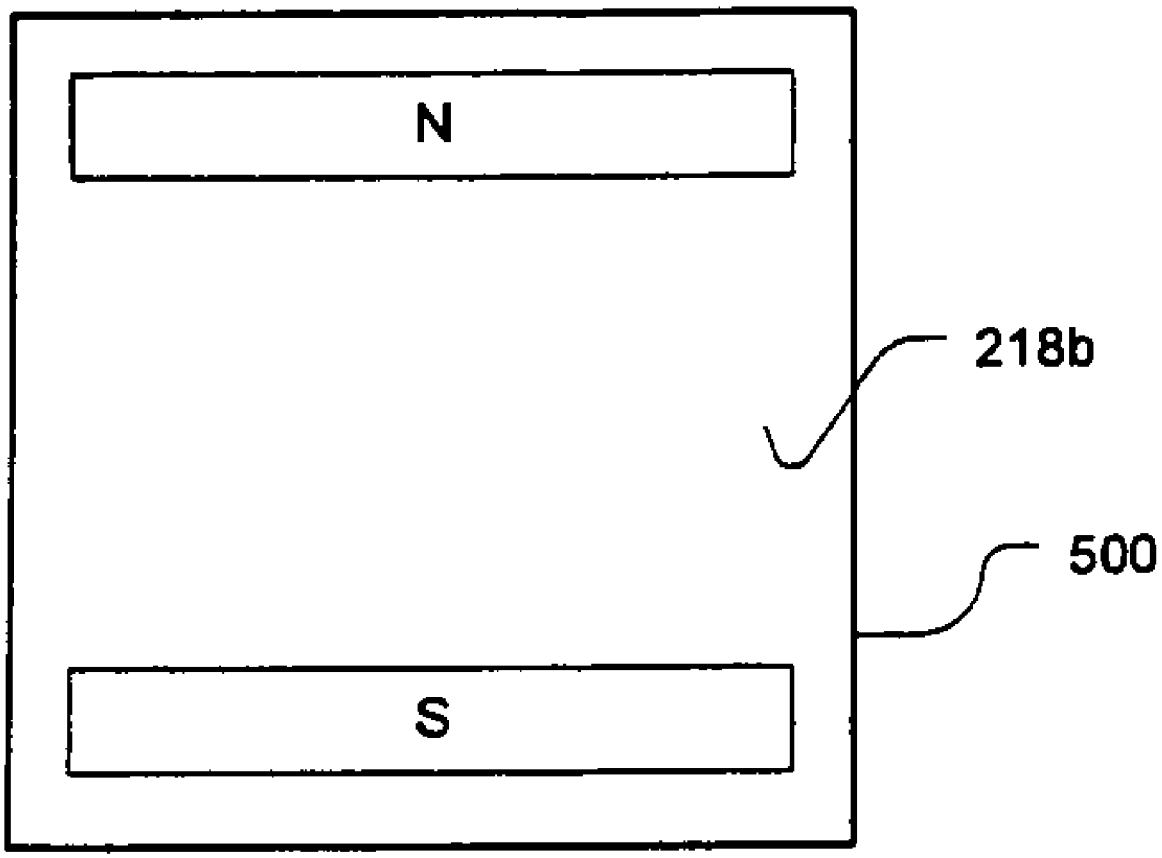
FIGS. 5 and 6 illustrate magnetization arrangements of magnetic material.
Figure 6:
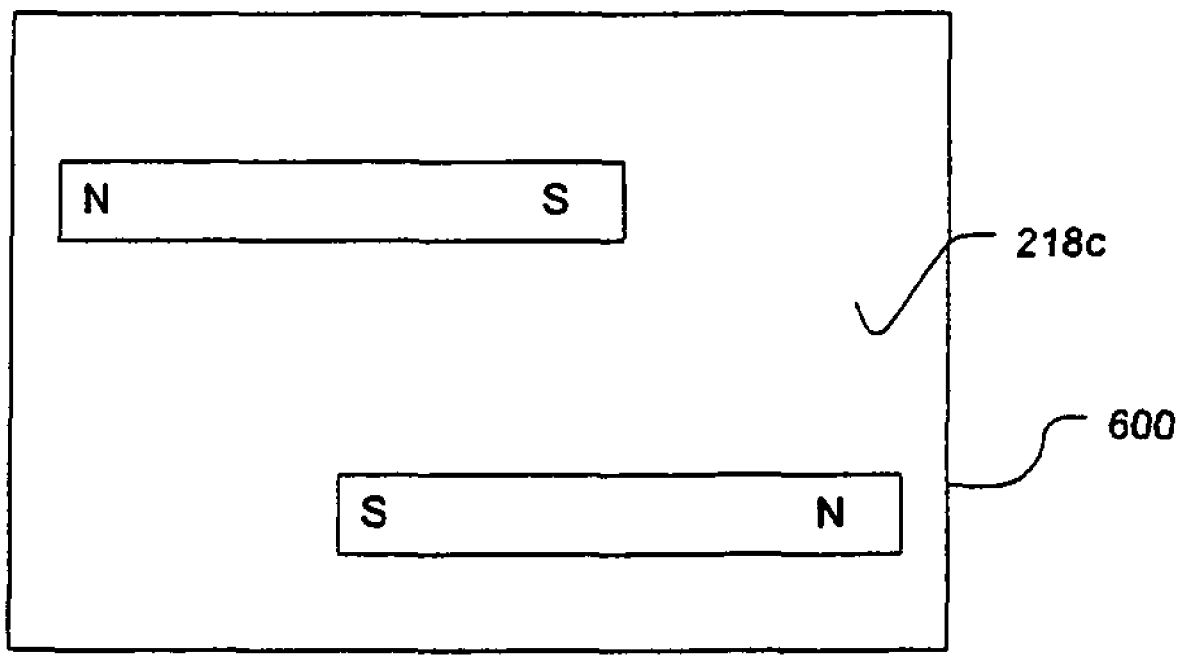

The second magnetic material 218 on the IC 204 may have a variety of magnetization arrangements. FIG. 5 illustrates one embodiment of the second magnetic material 218*b* having a perpendicular magnetization arrangement that may be disposed on a contact pad 500 of an IC. FIG. 6 illustrates another embodiment of the second magnetic-material 218*c* having a longitudinal magnetization arrangement that may be disposed on a contact pad 600.

To provide a more compact IC package assembly, an array of lead-frame elements may be used to assemble the ICs. The lead-frame elements may be used to make connection to an antenna substrate through ultrasonic sealing or other methods. The lead-frame elements may be a dense array to facilitate a more compact IC package assembly.

Figure 7:
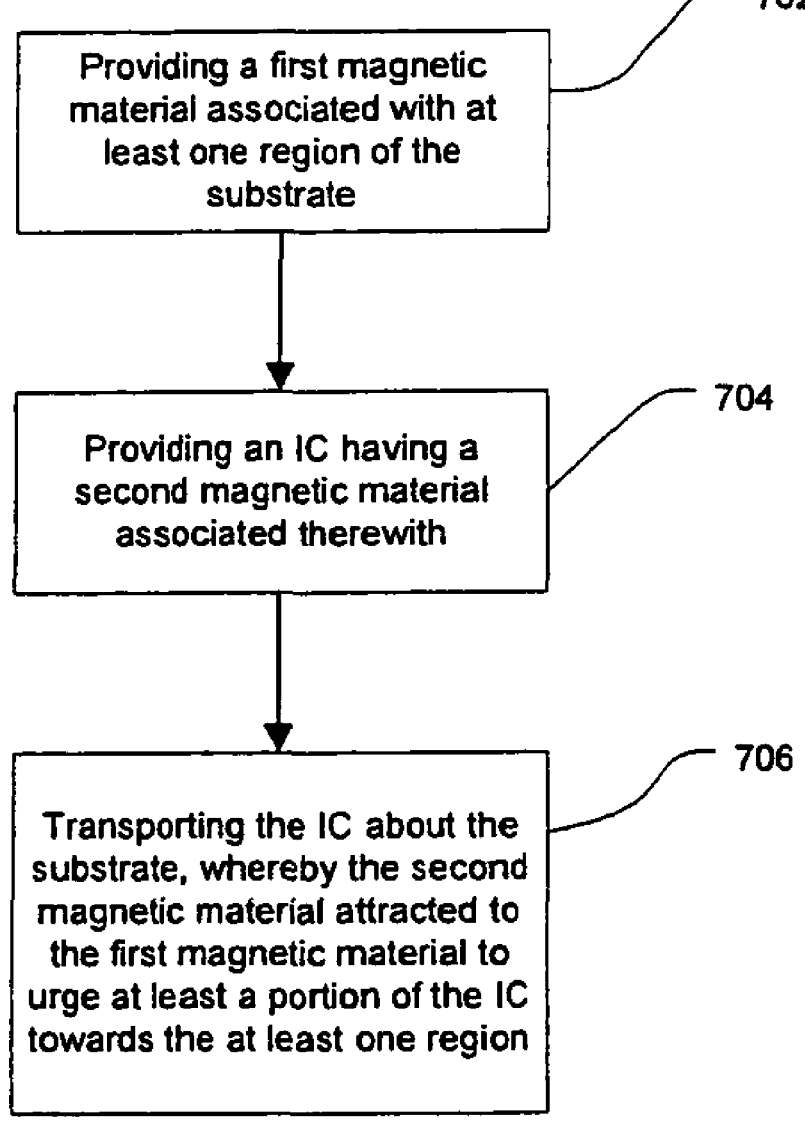
FIG. 7 illustrates operations according to an embodiment.

FIG. 7 is a flow chart of operations 700 consistent with an embodiment for assembling an IC to a substrate. Operation 702 may include providing a first magnetic material associated with at least one region of the substrate. Operation 704 may include providing an integrated circuit having a second magnetic material associated therewith. Finally, operation 706 may include transporting the integrated circuit about the substrate, whereby the second magnetic material is attracted to the first magnetic material to urge at least a portion of the integrated circuit towards the at least one region. One of several ways to transport the integrated circuit about the substrate may include providing a slurry including one or more ICs and a fluid and directing the fluid over the substrate.

According to one aspect of the invention, there is provided an integrated circuit package including a substrate and an integrated circuit. The substrate may include at least one region, and a first magnetic material may be associated with the at least one region. The integrated circuit may have a second magnetic material associated therewith. The second magnetic material may be attracted to the first magnetic material to couple the integrated circuit to the at least one region of the substrate.

According to another aspect of the invention, there is provided an RFID tag. The RFID tag may include a substrate and an integrated circuit. The substrate may include at least one region, and a first magnetic material associated with the at least one region. The substrate may further include an antenna for transmitting signals to and receiving signals from an associated RFID reader. The integrated circuit may have a second magnetic material associated therewith. The second magnetic material may be attracted to the first magnetic material to couple the integrated circuit to the at least one region of the substrate.

According to another aspect of the invention, there is provided a method of assembling an integrated circuit to a substrate including providing a first magnetic material associated with at least one region of the substrate; providing an integrated circuit having a second magnetic material associated therewith; and transporting the integrated circuit about the substrate, whereby the second magnetic material is attracted to the first magnetic material to urge at least a portion of the integrated circuit towards the at least one region.

Advantageously, in these embodiments the magnetic attraction of the first and second magnetic materials allows for magnetic self-assembly of an IC to a region of a substrate. This provides for efficient self-assembly reducing the need for higher priced conventional alternatives such as "pick and place" machines. This results in reduced IC packaging costs. In addition, the first and second magnetic materials may be utilized, e.g., together with a conductive material, to also form an electrical connection between the IC and circuitry of the substrate. As such, conventional wire-bonding processes and its associated components and costs may be avoided. The attraction of the first and second magnetic materials may also provide for better IC alignment than conventional alternatives such as a pick and place machine. The IC package manufactured according to magnetic self-assembly embodiments described herein may be utilized in a variety of devices and systems. One example is to manufacture RFID tags at reduced costs compared to conventional methods. Such RFID tags may be used in an RFID system for tagging retail merchandise in a retail environment where the cost of the RFID tag is an important factor.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A method of assembling an integrated circuit to a substrate comprising:
   providing a first magnetic material associated with at least one region of said substrate;
   providing an integrated circuit having a second magnetic material associated therewith;
   directing a slurry comprising said integrated circuit and a fluid over said substrate; and
   transporting said integrated circuit towards said at least one region of said substrate, whereby said second magnetic material is attracted to said first magnetic material to urge at least a portion of said integrated circuit towards said at least one region.

2. The method of claim 1, wherein one of said first and second magnetic materials comprises a permanent magnet and the other of said first and second magnetic materials comprises a magnetic material attracted to said permanent magnet.

3. A method of assembling an integrated circuit package, comprising:
   providing a substrate having circuitry therein:
   providing a first magnetic material associated with at least one region of said substrate;
   providing an integrated circuit having a second magnetic material associated therewith wherein said integrated circuit comprises at least one contact pad and said second magnetic material is disposed on said at least one contact pad;
   transporting said integrated circuit over said substrate toward said at least one region, whereby said second magnetic material is attracted to said first magnetic material to urge at least a portion of said integrated circuit towards said at least one region;
   establishing an electrical connection between said integrated circuit and said circuitry of said substrate through said first magnetic material and said second magnetic material; and
   electrically and magnetically coupling said integrated circuit to said at least one region of said substrate.

4. The method of claim 3, further comprising:
   applying a conductive material to one of said first and second magnetic materials; and
   positioning said first and second magnetic materials so that said conductive material contacts said first and second magnetic materials when said integrated circuit is deposited in said at least one region to establish an electrical connection between said integrated circuit and circuitry of said substrate.

5. The method of claim 4, wherein said conductive material comprises a thermally activated conductive adhesive and said method further comprises:
   heating said thermally activated conductive adhesive; and
   applying pressure to first and second magnetic materials to form said electrical connection.

6. The method of claim 3 wherein said circuitry comprises an antenna of an RFID tag.

7. The method of claim 3 wherein said first magnetic material comprises a plurality of polarities and said second magnetic material comprises a plurality of polarities to provide a desired orientation of said integrated circuit in said at least one region.

8. The method of claim 3, wherein one of said first and second magnetic materials comprises a permanent magnet and the other of said first and second magnetic materials comprises a magnetic material attracted to said permanent magnet.

9. The method of claim 3, wherein said step of transporting said integrated circuit over said substrate toward said at least one region comprises directing a slurry comprising said integrated circuit and a fluid over said substrate.

10. The method of claim 3, wherein said step of transporting said integrated circuit over said substrate toward said at least one region comprises vibrating said substrate.

11. The method of claim 1, wherein said first magnetic material comprises a plurality of polarities and said second magnetic material comprises a plurality of polarities to provide a desired orientation of said integrated circuit in said at least one region.

12. The method of 1, wherein the substrate contains circuitry, and said circuitry comprises an RFID antenna.

13. A method of assembling an integrated circuit to a substrate comprising:
    providing a first magnetic material associated with at least one region of said substrate;
    providing an integrated circuit having a second magnetic material associated therewith;
    vibrating said substrate to transport said integrated circuit over said substrate towards said at least one region, whereby said second magnetic material is attracted to said first magnetic material to urge at least a portion of said integrated circuit towards said at least one region.

14. The method of claim 13, wherein one of said first and second magnetic materials comprises a permanent magnet and the other of said first and second magnetic materials comprises a magnetic material attracted to said permanent magnet.

15. The method of claim 13, wherein said first magnetic material comprises a plurality of polarities and said second magnetic material comprises a plurality of polarities to provide a desired orientation of said integrated circuit n said at least one region.

16. The method of 13, wherein the substrate contains circuitry, and said circuitry comprises an RFID antenna.

* * * * *